United States Patent [19]
Liebenow et al.

[11] Patent Number: 5,876,218
[45] Date of Patent: Mar. 2, 1999

[54] PIGGY BACK PC CARD

[75] Inventors: Frank W. Liebenow; Robert J. Burnett, both of Dakota Dunes, S. Dak.

[73] Assignee: Gateway 2000, Inc., North Sioux City, S. Dak.

[21] Appl. No.: 864,493

[22] Filed: May 28, 1997

[51] Int. Cl.[6] ........................................... H01R 9/09
[52] U.S. Cl. ............................................. 439/74; 439/946
[58] Field of Search .................................. 439/638, 945, 439/946, 74, 92; 361/686

[56] References Cited

U.S. PATENT DOCUMENTS

| | | | |
|---|---|---|---|
| 4,950,170 | 8/1990 | Miller, Jr. | 439/92 |
| 5,183,404 | 2/1993 | Aldous et al. | 439/55 |
| 5,336,099 | 8/1994 | Aldous et al. | 439/131 |
| 5,338,210 | 8/1994 | Beckham et al. | 439/131 |
| 5,375,037 | 12/1994 | Le Roux | 439/638 |
| 5,406,450 | 4/1995 | Shieh | 361/686 |
| 5,562,504 | 10/1996 | Moshayedi | 439/638 |
| 5,608,607 | 3/1997 | Dittmer | 439/946 |
| 5,619,396 | 4/1997 | Gee et al. | 361/686 |

*Primary Examiner*—Neil Abrams
*Assistant Examiner*—Barry M. L. Standig
*Attorney, Agent, or Firm*—Schwegman, Lundberg, Woessner & Kluth, P.A.; Anthony Claiborne

[57] ABSTRACT

An expansion device is provided having two expansion cards interconnected. While the first expansion card of the expansion device conforms to the footprint requirements of the PCMCIA, the second expansion card ranges in size. The expansion device integrates into the overall configuration that conforms with PCMCIA card architecture. A connector releasably attaches the two expansion cards together. Once attached, the expansion card acts as a slave card to the master PC card. Alternatively, the first expansion card can be used by itself as an expansion device. Guide pins are provided for guiding the attachment of the expansion cards. The guide pins, in addition, provide an electrical ground from the PC card to the expansion card. An adaptor is also provided with the expansion device for providing an electronic interface between a host computer and a transmission media line.

21 Claims, 5 Drawing Sheets

PIGGY BACK PC CARD

FIELD OF THE INVENTION

The present invention relates generally to computers. More particularly, it pertains to an expansion device for a portable computer.

BACKGROUND OF THE INVENTION

The use of computers becomes more prevalent every day. In particular, the use of portable computers has increased as people become more reliant on using a computer everywhere they travel. Furthermore, the size of computer devices has decreased while simultaneously the capabilities per unit volume has increased. As a result, computer manufacturers face many design challenges in creating a smaller, more powerful computer.

The design challenges for portable computers require that the computer be light weight, by today's standards, and yet remain as powerful as some desktop computers. One approach to expanding the capability of a computer, while maintaining or reducing the weight of the device, is to incorporate removable devices into the system which expand the number of functions and the computing capacity of the computer.

Each computer manufacturer often has its own unique approach to their computer product. As a result, there is little interchangeability between many computer accessories and devices. Although they have generally not significantly increased in price over the past several years, computers are nonetheless a major purchase for most consumers. Thus, without standardization, consumers must choose which computer manufacturer from whom they wish to buy their computer and all of the accessories.

As consumers buy and use computers for wider and more diverse applications, a computer user must be able to customize the capabilities of their computer in accordance with their individual needs. Furthermore, computer users' needs may change over the lifetime of the computer. However, each computer manufacturer may not provide the diversity in devices necessary for customizing a computer for a particular user. Therefore, it would be advantageous if a computer user could customize their computer after its purchase using a wide variety of accessories and devices from multiple sources of computer manufacturers.

One device computer users have employed to customize their computers is a PC (Personal Computer) card. The PCMCIA (Personal Computer Memory Card International Association) standard was created in order to provide a standardized, more stream lined approach to the interchangability of PC cards. The standard establishes a credit-card-size package which can be plugged into a 68-pin host adapter socket built into the computer. Each package maintains the same slot width and depth, but the thickness of each card can differ. The PCMCIA developed three different slot thicknesses which include Type I, Type II, and Type III. The three current different slot thicknesses are: Type I=3.3 mm, Type II=5.0 mm, and Type III=10.5 mm.

The PCMCIA standard was developed by several different computer manufacturers. The single standard provides for uniformity in PC cards. When computer manufacturers comply with the design requirements of the PCMCIA standard, computer users can purchase a wider variety of products for use with their computer, regardless of the computer manufacturer, due to the interchangability of the products. PC cards in compliance with the PCMCIA standard are independent of the operating system or devices; the peripheral cards can be plugged into a PC, Mac, Newton, or future generation computers.

While PC cards have advanced computer capabilities, software programs continue to require additional power and storage. Accordingly, what is needed is a way to expand computer capabilities while accommodating current weight restrictions. What is further needed is a way to implement the expansion in current devices.

SUMMARY OF THE INVENTION

A first expansion card has a connector that directly connects with a connector on a second expansion card. The connector couples the two cards such that they are insertable into a connector bay having a predetermined thickness. The two expansion cards are connected such that the overall thickness is equivalent to or thinner than a Type III PC card.

In accordance with one aspect of the present invention, an expansion device has a first expansion card interconnected with a second expansion card. The first expansion card and the second expansion card are insertable within a single PCMCIA connector bay. The first expansion card and the second expansion card may have the same footprint, or the second expansion card may be smaller than the first expansion card. The first expansion card can conform with the physical requirements of the PCMCIA, and can conform with the electrical architecture set out by the PCMCIA. For any type of PCMCIA card, the physical footprint of the PC card is 85 mm by 55 mm.

In one embodiment, the expansion cards are interconnected by pins and apertures which are formed integral within each of the expansion cards. In another embodiment, the expansion cards are interconnected by a connection device of which the female portion occurs on the first card and the male portion occurs on the expansion card. In yet another embodiment, the first expansion card can be used either in conjunction with the second expansion card, or the first expansion card can be used alone in the connector bay. Alternatively, the expansion cards can be interconnected by mating topology of the card bodies.

In addition to the interconnection device between the first expansion card and the second expansion card discussed above, the expansion cards are also provided with grounding members. The grounding members, in one embodiment comprising grounding pins and respective grounding apertures, provide additional physical structure to the interconnection between the two expansion cards. The grounding members also can provide a way to electrically ground the second expansion card to the first expansion card. For increased stability, the grounding members can be placed in the four corners of the expansion cards.

Pertaining to another aspect of the invention, the first expansion card has a first connector, a second expansion card has a second connector, and the two expansion cards are connected at the connector. The expansion card can have an additional connector for attaching an external device, such as an antenna. An adaptor is also mounted within the first expansion card for mating with media transmission lines. The adaptor may include a standard RJ-11 or an RJ-45 modular plug, or other suitable devices. The first expansion card further includes an interface for communicating with a computer.

Another aspect of the invention includes an expanded portable computer. The computer has an expansion device where two expansion cards are interconnected and then inserted into a single PCMCIA connector bay. In one embodiment, the connector bay is a Type III PCMCIA connector bay. Alternatively, one single expansion card could be inserted into the PCMCIA connector bay for use as an expansion device.

The expansion device provides a convenient way to expand the capabilities of a computer without significantly adding to the weight of the computer. The expansion device does not detract from the portability of the portable computer. Furthermore, the expansion device can be used in current PCMCIA connector bays. Economically advantageous, the expansion device only requires one interface, such as a 68-pin connector and eliminates redundant circuitry of using two expansion cards.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the spirit and scope of the present invention. Therefore, the following detailed description is not to be taken in a limiting sense, and the scope of the present invention is defined by the appended claims.

Figure 1:
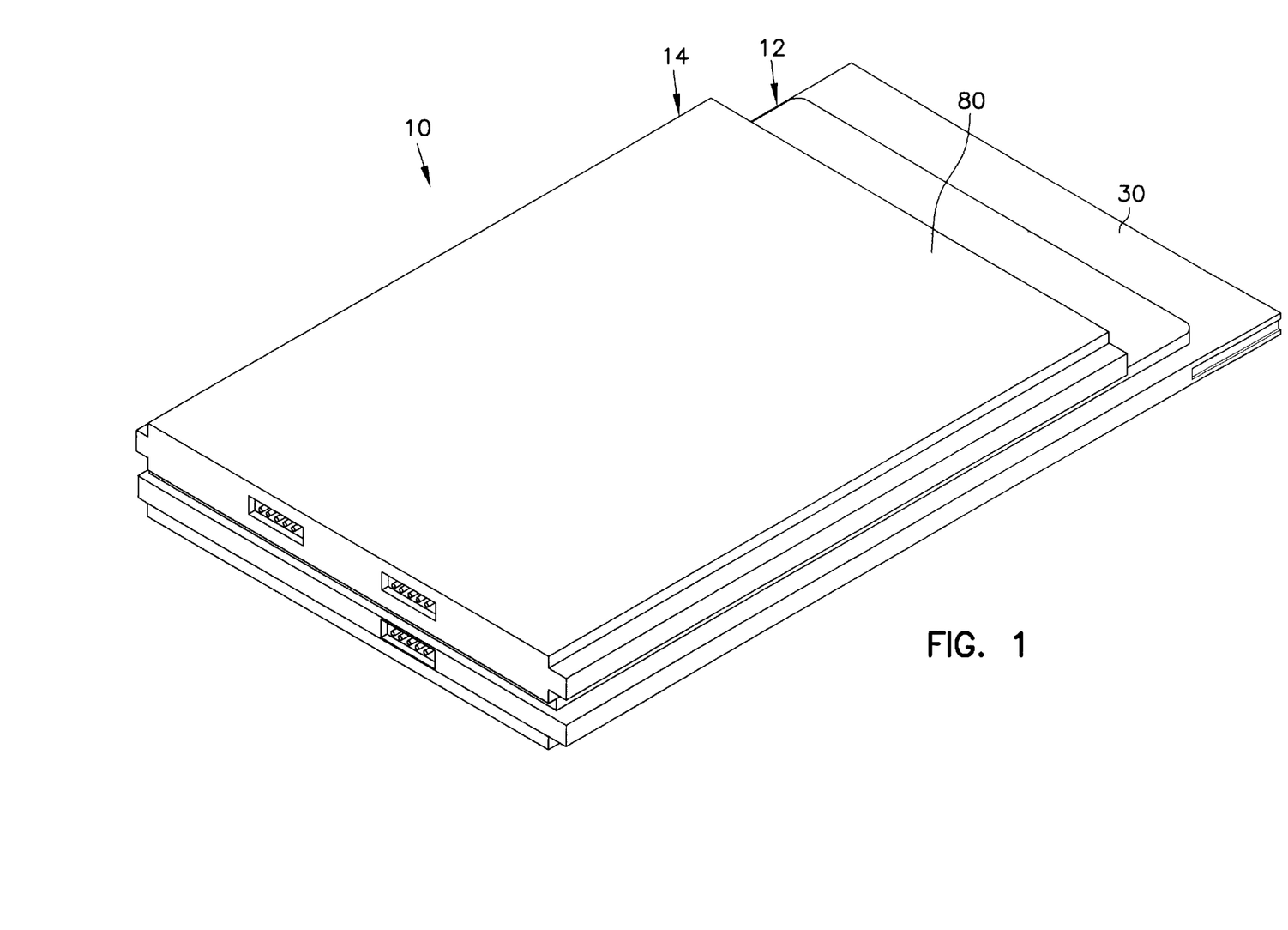
FIG. 1 is a perspective view illustrating an expansion device constructed in accordance with one embodiment of the present invention.

FIG. 1 illustrates an expansion device 10 in accordance with one embodiment of the present invention. The expansion device 10 comprises a set of expansion cards 12, 14, including a first expansion card 30 and a second expansion card 80, which each desirably have a card-like shape. The expansion device 10 is configured to be inserted into other devices having compatible connector bays, which provide for support of the expansion device. The expansion device 10 can be compatible with the parameters established by the Personal Computer Memory Card International Association (PCMCIA).

In one embodiment, each individual component of the expansion device 10 is also configured in accordance with the parameters involving width and height of the card body established the PCMCIA for Type II PC Cards. In this manner, the expansion device 10 has a standardized size and shape so as to be compatible with standardized PCMCIA connector bays. The expansion device 10 thus can be used with a wide variety of personal computers, including, but not limited to, desktop computers, portable computers, laptop computers, notebook computers, sub-notebook computers, palmtop computers and personal digital assistants, provided however, that such host systems include a suitable PCMCIA connector bay.

Figure 2A:
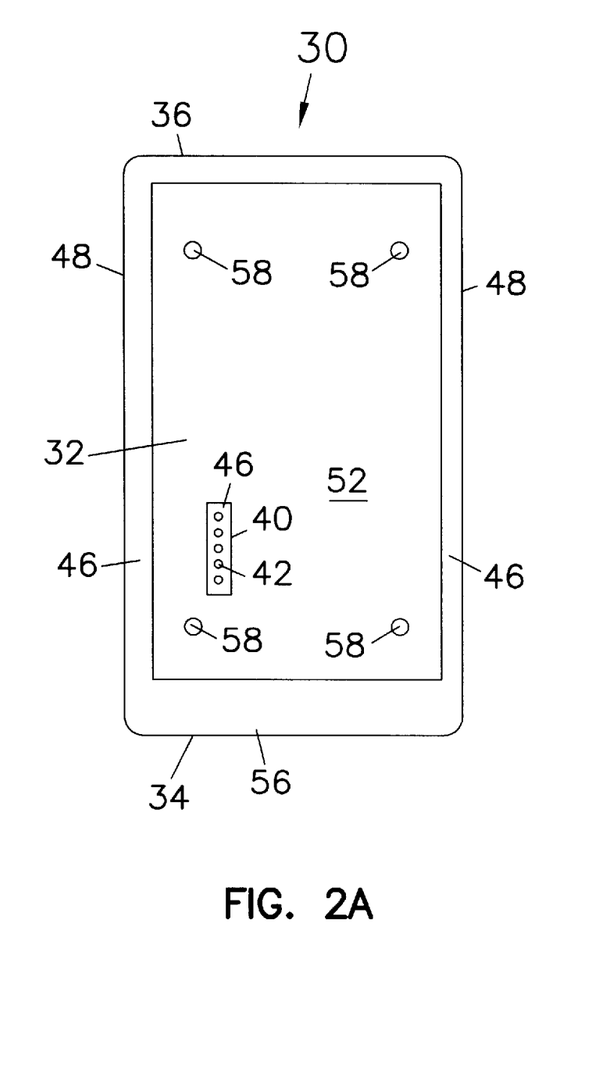
FIG. 2A is a first side elevational view illustrating a first card of an expansion device constructed in accordance with one embodiment of the present invention.
Figure 2B:
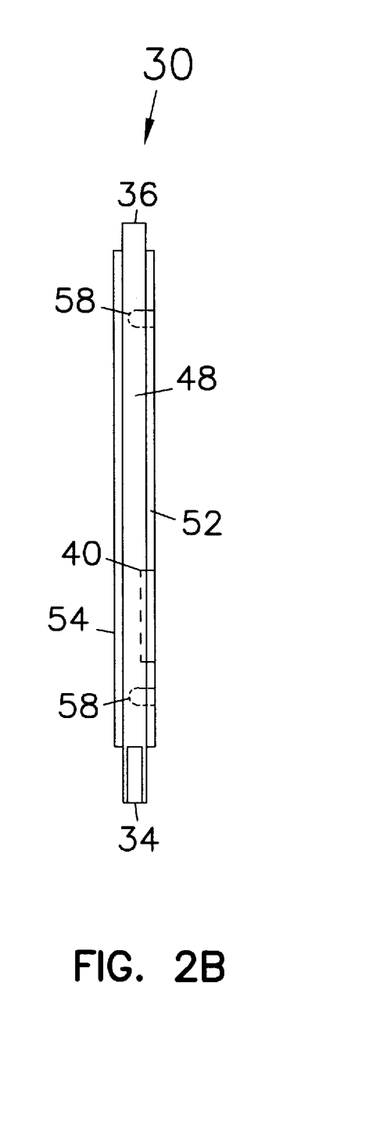
FIG. 2B is a second side elevational view illustrating a first card of an expansion device constructed in accordance with one embodiment of the present invention.

As illustrated in FIGS. 2A and 2B, a first expansion card 30 includes a first card body 32. Generally, the first card body 32 has a rectangular shape. The first card body 32 has an upper planar surface 52 and a lower planar surface 54, where the two surfaces 52, 54 are substantially parallel with one another. The first card body 32 also includes a front end 34 and a rear end 36. As used herein, the terms "front" and "rear" are used in reference to the direction in which the card body is inserted into a computer connector bay. The front and rear ends 34, 36 are generally parallel to each other and the front end 34 defines the overall width of the expansion device 10.

In accordance with the PCMCIA standard, the first expansion card 30 generally has a rectangular configuration. The first expansion card 30 desirably has a length equal to about 85 mm, a width equal to about 55 mm and an overall thickness equal to about 5 mm. As those skilled in the art will readily appreciate, however, an expansion device incorporating the present invention can be manufactured in any of a wide variety of sizes and configurations in order to suit specific applications. The first expansion card 30 is also configured to connect with a host device, such as a portable computer. Near the front end 34, the first expansion card 30 has an interface for accommodating this connection. In one embodiment, a 68-pin connector 56 is formed integral within the first expansion card 30 proximate to the front end 34, although other types of interface are within the scope of the invention.

The first card body 32 also includes a pair of rails 46 which generally extend along opposite side surfaces 48 of the card body 32. The pair of rails are disposed along the side surfaces 48 between the front and rear ends 34, 36 of the first card body 32. The rails 48 are configured to mate with correspondingly shaped grooves within a PCMCIA connector bay (not shown) to facilitate proper alignment and position of the expansion device 10 when inserted into the connector bay, as known in the art.

Disposed on an upper planar surface 52 is a female connector 40. The female connector 40 has a plurality of interconnection apertures 42 therein. In one embodiment, the connector 40 and the plurality of interconnection apertures 42 are integral with the first expansion card 30. The apertures 42 are electrically coupled with the printed circuit board (not shown) and provide for an electrical connection therewith for connecting circuitry of the expansion card (not shown). Although the connector 40 is shown proximate to the front end 34 of the first expansion card 30, the connector 40 may be disposed in a variety of different locations on the upper planar surface 52 of the first expansion card 30.

The upper planar surface 52 also has grounding apertures 58 disposed therein. The grounding apertures 58 are circular in shape and can be disposed in each corner of the first expansion card 30. Alternatively, the grounding apertures 58 can be provided in a variety of shapes or in a variety of locations to accommodate a multitude of shapes and locations of mating grounding devices for insertion therein. The apertures 58 provide for additional physical structure for connecting with another expansion card when other devices are inserted therein. Additionally, the grounding apertures 58 provide an electrical ground to devices which are electrically connected therewith.

Figure 3A:
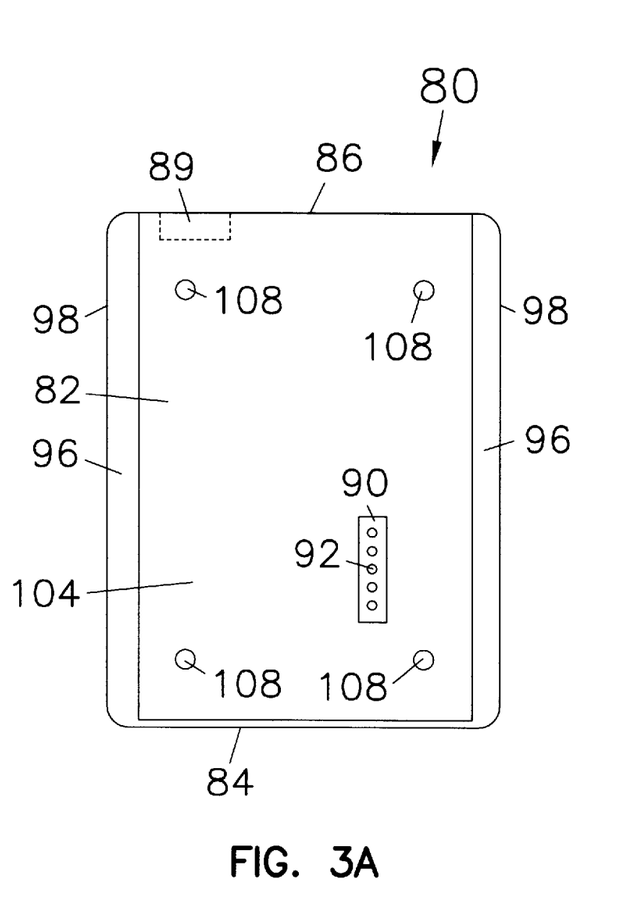
FIG. 3A is a first side elevational view illustrating a second card of an expansion device constructed in accordance with one embodiment of the present invention.
Figure 3B:
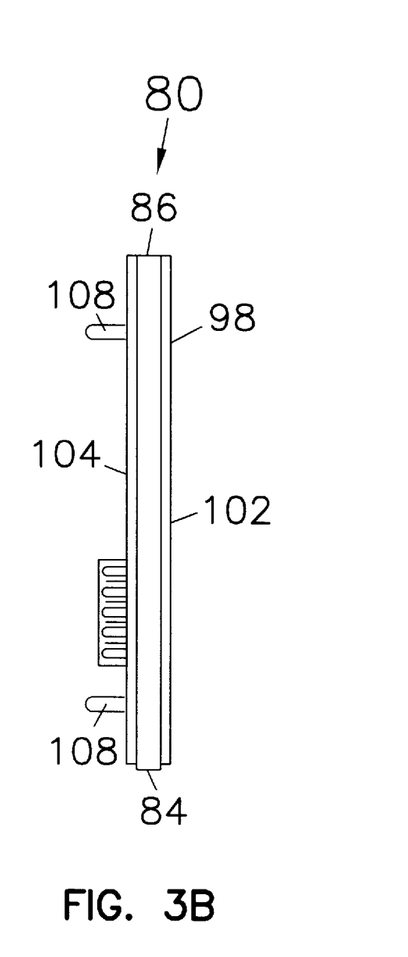
FIG. 3B is a second side elevational view illustrating a second card of an expansion device constructed in accordance with one embodiment of the present invention.

As shown in FIGS. 3A and 3B, the second expansion card 80 includes a second card body 82. Generally, the second card body 82 has a rectangular shape. The second card body 82 has an upper planar surface 102 and a lower planar surface 104, where the two surfaces 102, 104 are substantially parallel with one another. The second card body 82 also includes a front end 84 and a rear end 86. As used herein, the terms "front" and "rear" are used in reference to the direction in which the card body is inserted into a connector bay. The front end 84 is inserted first into a connector bay. The front and rear ends 84, 86 are generally parallel to each other. Although a smaller card is shown, the expansion card can also conform with the physical requirements of the PCMCIA, where the width of the expansion card is approximately 55 mm and the length of the card is 85 mm. However, in one embodiment, the second expansion card 80 has a smaller footprint than the parameters set by the PCMCIA standard. For instance, the second expansion card 80 could have a width of less than 55 mm. The foot print of the second expansion card 80 could even be as small as 3 mm×3 mm. Alternatively, the second expansion card 80 could have peripheral devices (not shown) attached thereto which extend out of the connector bay while the expansion device 10 is inserted within the connector bay.

The second expansion card 80 can also be configured to connect with a host device, such as a portable computer. In one embodiment, the second expansion card 80 has a PCMCIA connector (not shown) near the front end 84 for accommodating this connection. In another embodiment, a 68-pin connector is formed integral within the second expansion card 80 proximate to the front end 84, although other types of interface are within the scope of the invention. Additional connectors can be provided on the second expansion card 80, such as for receiving an antenna therein. A connector 89 for the antenna can be formed on the rear end 86 of the second expansion card 80.

Disposed on the lower planar surface 104 is a male connector 90. The male connector 90 has a plurality of interconnection pins 92 therein. In one embodiment, the connector 90 and the plurality of interconnection pins 92 are integral with the second expansion card 80. The connector 90 of the second expansion card 80 can also be shrouded. Shrouding the connector 90 provides protection to the interconnection pins 92 from physical damage. The pins 92 provide electrical connection therewith for connecting circuitry of the expansion card (not shown) as known in the art. In one embodiment, the connector 90 provides a way to electrically ground the second expansion card 80. Although the male connector 90 is shown proximate to the front end 84 of the second expansion card 80, the male connector 90 may be disposed in a variety of different locations on the lower planar surface 104 of the second expansion card 80 as long as the male connector 90 corresponds positionally with the female connector 40 of the first expansion card 30.

Figure 4:
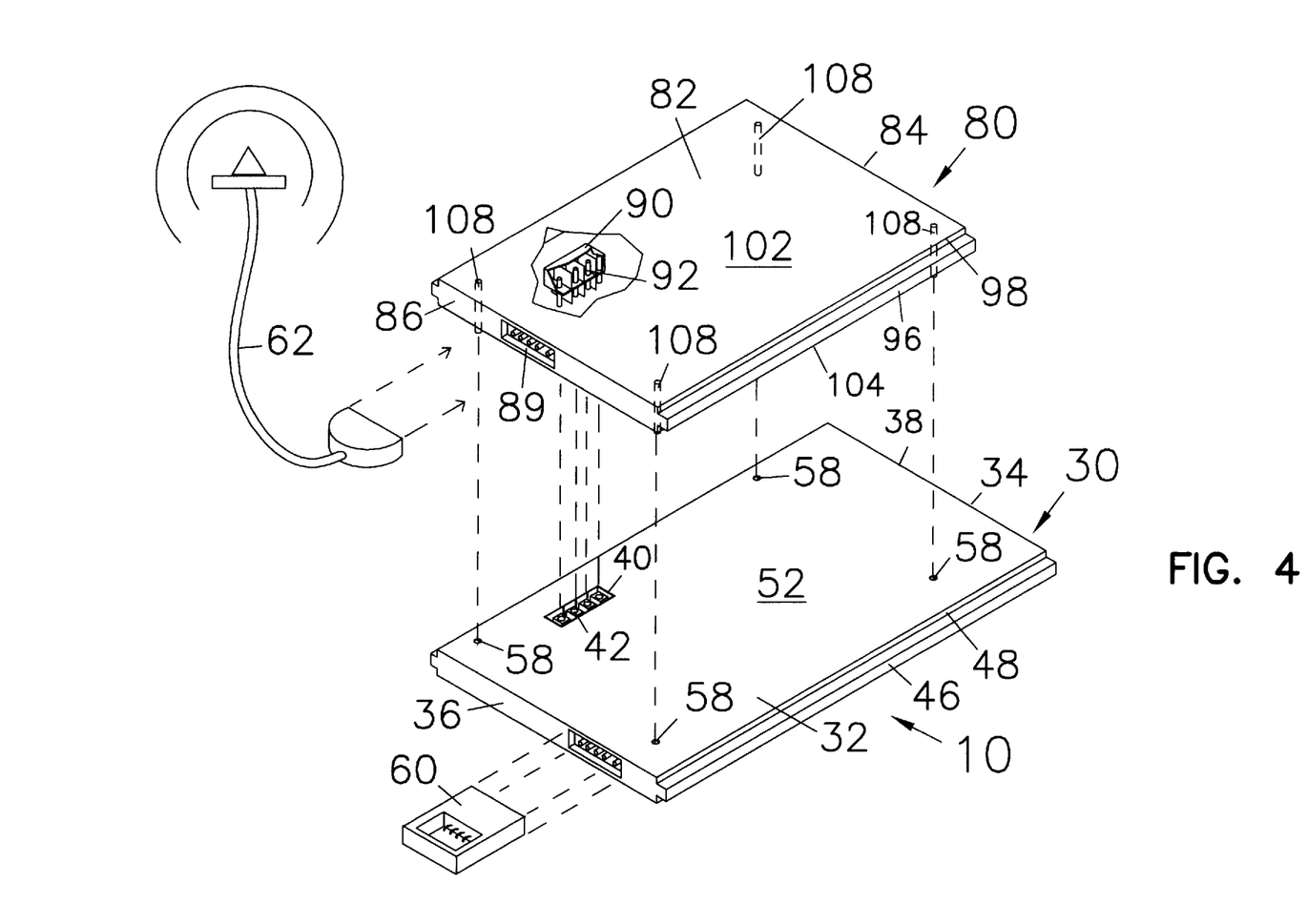
FIG. 4 is an exploded view illustrating an expansion device constructed in accordance with one embodiment of the present invention.

Extending from the lower planar surface 104 are grounding pins 108. The grounding pins 108 are circular in shape and are disposed in each corner of the second expansion card 80. Alternatively, the grounding pins 108 could have other shapes, such as rectangular or triangular, and yet remain within the scope of the invention. The grounding pins 108 provide for additional physical structure for connecting with another expansion card when inserted into the grounding apertures 58, as shown in FIG. 4. Specifically, the grounding pins 108 are spaced and dimensioned to be received by the grounding apertures 58 of the first expansion card 30. The grounding pins 108 connect the second expansion card 80 to the electrical ground supplied by the first expansion card 30 when the grounding pins 108 are electrically connected with the grounding apertures 58. Advantageously, the grounding pins 108 and the grounding apertures 58 ground the expansion device 10 against EMI. To provide grounding against EMI, the grounding pins 108 and the grounding apertures 58 would be grounded to the first and second card bodies 32, 82, and the card bodies would have a metal shell. Alternatively, the grounding pins 108 and the grounding apertures 58 provide only physical structure for the expansion device 10. Furthermore, other structures can be used to provide the physical connection between the first expansion card 30 and the second expansion card 80. For instance, the first expansion card 30 can have a topology which physically mates with topology on a surface of the second expansion card 80.

The grounding apertures 58 and pins 108 are shown in the four corners of the first expansion card 30 and the second expansion card 80. Although four grounding pins and four grounding apertures are shown, any number of pins and apertures may be used. Furthermore, corner placement of the pins and apertures is considered only one embodiment, and these pins and respective apertures may be placed in a variety of locations on the expansion cards and yet remain within the scope of the invention.

FIG. 4 illustrates an exploded view of one embodiment of the expansion device 10, which shows how the expansion cards fit together. The device 10 is comprised of the first expansion card 30 and the second expansion card 80. The device 10 is assembled by facing the lower planar surface 104 of the second expansion card 80 toward the upper planar surface 52 of the first expansion card 30, and pointing the front end 34 of the first expansion card 30 in the same direction as the front end 84 of the second expansion card 80. The grounding pins 108 are aligned with the grounding apertures 58, and the male connector 90 is then inserted into the female connector 40. Simultaneously, the grounding pins 108 are inserted into the grounding apertures 58. When assembled, the expansion device 10 has a thickness of approximately 10.5 mm or less, which conforms with the PCMCIA standard for Type III PC cards. The expansion device 10 can then be inserted into a Type III connector bay.

In another embodiment, the expansion device 10 has an adaptor 60 for receiving a terminal connector or plug at the end of a transmission media line. The adaptor is disposed proximate the rear end 36 of the first expansion card 30. It is contemplated that the adaptor 60 can be configured to receive a specific plug type of any of a variety of plug types used at a terminal end of a transmission media line. Thus, for instance, with respect to modem or fax/modem applications, the adaptor 60 may be configured to receive a standard RJ-11, 4 or 6 position, miniature modular plug which is commonly used with conventional 4 or 6 strand telephone transmission lines. For Local Area Network (LAN) applications, the adaptor may be configured to receive a standard RJ-45, 8 pin modular plug commonly used with twisted-pair cable.

In the illustrated embodiment, the adaptor 60 is configured to engage an RJ-11 modular plug where the expansion device is designed for modem or fax/modem applications. It is contemplated, however, that those skilled in the art will readily appreciate that the present invention could be adapted for use with other types of connectors, such as, for example, an RJ-45 modular connector, a BNC connector or a modular card edge connector, as well. Also shown is an antenna 62. The expansion device 10 is configured to attach with the antenna 62 at the connector 89 for the antenna. The connector 89 receives the antenna 62 therein.

Figure 5:
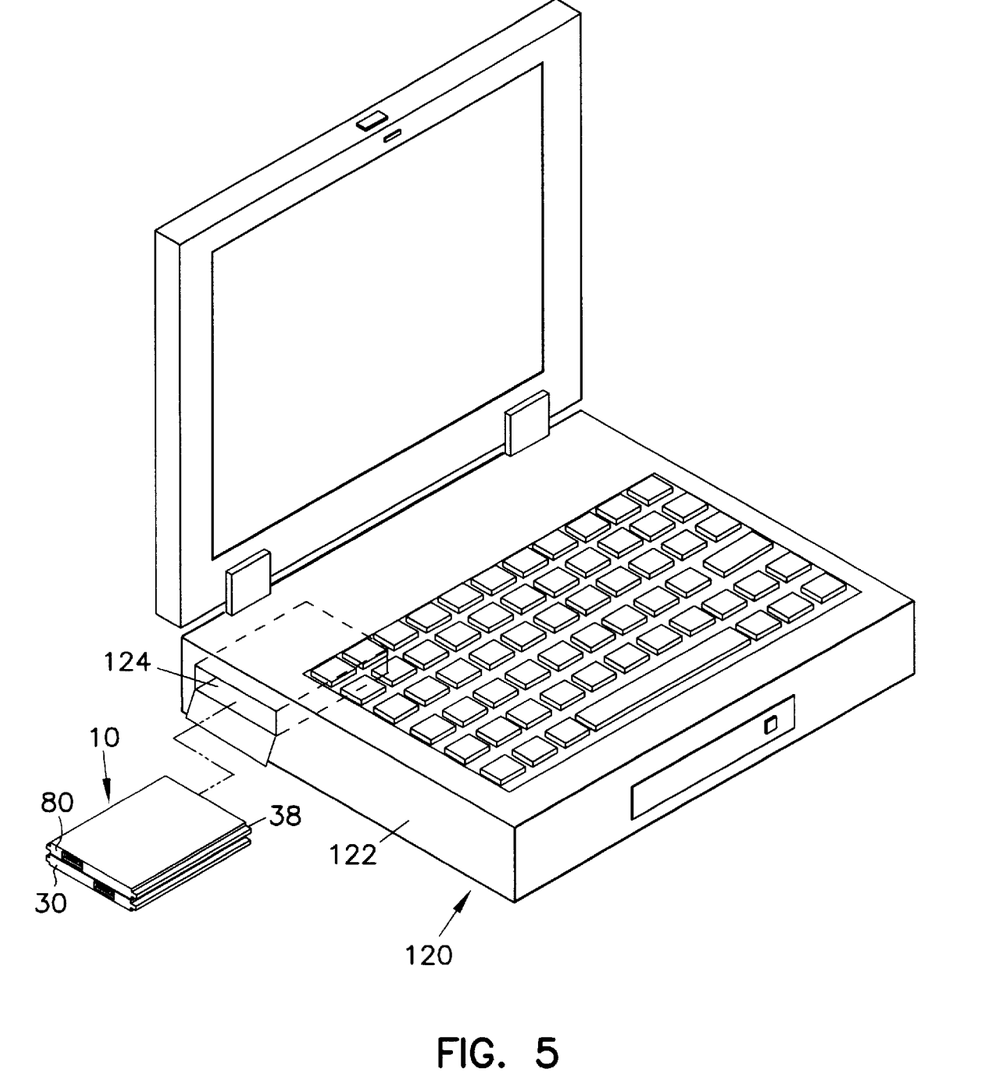
FIG. 5 is a perspective view illustrating the expansion device inserted into a portable computer as constructed in accordance with another embodiment of the present invention.

FIG. 5 illustrates another embodiment where the expansion device 10 is installed in a portable computer 120. The first expansion card 30 can have the same size footprint as the second expansion card 80, as shown. The portable computer 120 has a connector bay 124 therein. The connector bay 124 is disposed in a side surface 122 of the portable computer 120 and is configured in accordance with PCMCIA standards. Within the connector bay is an interface (not shown) for mating with the interface 38 of the expansion device 10. The connector bay 124 is sized to receive the expansion device 10 therein. In one embodiment the connector bay 124 is configured and dimensioned in accordance with a PCMCIA Type III connector bay. In another embodiment, the expansion apparatus 10 communicates with the host platform of the computer 120 via a serial, parallel, SCSI, or like port, when plugged into the connector bay. In the illustrated embodiment, the expansion device 10 plugs into a standard 68-pin connector (not shown) within the connector bay 124 which is coupled to a bus structure of the host computer system 124, as known in the art.

The expansion device 10 increases the memory and/or functional capabilities of electronic devices without adding significant weight. The expansion device advantageously conforms with industry standards, allowing for use in other computer systems. The device also permits increased flexibility to computer users. The computer user can increase memory or incorporate a modem, or incorporate other devices in accordance with individual needs.

The expansion device allows for increased functionality of an individual expansion card, such as a PC card. A modem can also incorporate other devices, for instance, an answering machine, and still fit within connector bays conforming with the PCMCIA industry standard. The expansion device permits many permutations of devices for use within the PCMCIA standard connector bay. For example, the second expansion card could incorporate a modem, while the first expansion card accommodates wireless features for use with the modem. Alternatively, the first expansion card could be used for logic circuitry, while the second expansion card contains memory for use with the expansion card.

The expansion device provides a convenient way to expand the capabilities of a computer, yet can be used in current PCMCIA connector bays. Moreover, the expansion device does not detract from the portability of the portable computer. Economically advantageous, the expansion device only requires one interface, such as a 68-pin connector and eliminates redundant circuitry of using two PC cards, thereby rendering a cost effective expansion device. The expansion device provides further flexibility and can easily be enhanced in accordance with a particular computer user's needs.

It is to be understood that the above description is intended to be illustrative, and not restrictive. Many other embodiments will be apparent to those of skill in the art upon reviewing the above description. For instance, the expansion cards of the expansion device is designed not to be limited to computers, but also can be used in any digital electronic device, such as CAD workstations or cameras. The scope of the invention should, therefore, be determined with reference to the appended claims, along with the full scope of equivalents to which such claims are entitled.

What is claimed is:

1. An expansion card for coupling with another expansion card to form an expansion device, the expansion card comprising:
   an upper planar surface;
   a lower planar surface, the lower planar surface being substantially parallel to the upper planar surface;
   a plurality of grounding members disposed on the lower planar surface, wherein the grounding members comprise a plurality of pins adapted for matably engaging with grounding apertures; and
   a plurality of interconnection pins disposed on the lower planar surface, the interconnection pins providing for an electrical connection therewith.

2. The expansion card as recited in claim 1, wherein each grounding member is disposed proximate to a corner of the expansion card.

3. An expansion device comprising:
   a first expansion card being defined by upper and lower planar surfaces and a front end, the upper planar surface of the first expansion card having a first connector mounted thereon, the first expansion card having a predetermined width and length compatible with a first and a second computer connector bay, the first expansion card having a plurality of grounding apertures disposed on the upper planar surface;
   a second expansion card being defined by an upper and lower planar surface and a rear end, the lower planar surface of the second expansion card having at least one second connector mounted thereon, the second expansion card having a predetermined width and length, the second connector being adapted for mating with the first connector, the second expansion card having a plurality of grounding pins disposed on the lower planar surface, the second expansion card being interconnected with the first expansion card such that the combination of interconnected expansion cards is compatible with the second computer connector bay; and
   said first card having an interface mounted on the front end for communicating with a computer.

4. The expansion device as recited in claim 3, wherein the interface comprises a 68-pin connector.

5. The expansion device as recited in claim 3, wherein the expansion card has an antenna mounted on the rear end.

6. The expansion device as recited in claim 3, wherein the expansion card is further defined by a front end, the front end of the expansion card having a PCMCIA interface.

7. The expansion device as recited in claim 3, wherein the first expansion card has PCMCIA Type II architecture.

8. The expansion device as recited in claim 3, wherein the second expansion card has PCMCIA Type II architecture.

9. The expansion device as recited in claim 3, wherein a footprint of the first expansion card is dimensioned approximately 85 mm×55 mm.

10. The expansion device as recited in claim 3, wherein a footprint of the second expansion card is dimensioned approximately 85 mm×55 mm.

11. The expansion device as recited in claim 3, wherein a footprint of the second expansion card is dimensioned smaller than the first expansion card.

12. The expansion device as recited in claim 3, wherein the combination of the interconnected first and second expansion cards has a thickness of approximately 10.5 mm.

13. The expansion device as recited in claim 3, wherein the grounding pins are cylindrically shaped.

14. The expansion device as recited in claim 3, wherein the grounding apertures and the grounding pins are equally spaced apart on the first and second expansion cards.

15. The expansion device as recited in claim 3, wherein the first connector comprises a female connector body having a plurality of apertures therein, and the second connector comprises a male connector body having a plurality of pins therein.

16. The expansion device as recited in claim 15, wherein the plurality of apertures correspond in quantity and dimension to the plurality of pins.

17. The expansion device as recited in claim 15, wherein the plurality of apertures and the plurality of pins form an electrical connection therebetween.

18. An expansion device comprising:

a first expansion card being defined by an upper and lower planar surface and a front and rear end, the upper planar surface of the first card having a first connector mounted thereon, the first expansion card having a predetermined width and length;

an adaptor mounted on the rear end of the first expansion card, said adaptor for mating with media transmission lines;

a second expansion card being defined by an upper and lower planar surface and a rear end, the lower planar surface of the expansion card having at least one second connector mounted thereon, the second expansion card having a predetermined width and length, the second connector being adapted for mating with the first connector;

said second expansion card being interconnected with the first expansion card; and said first expansion card having an interface mounted on the front end for communicating with a computer.

19. The expansion device as recited in claim 18, wherein the adaptor is configured to receive and electrically connect to a standard RJ-11 miniature modular plug for connection with conventional telephone transmission lines.

20. The expansion device as recited in claim 18, wherein the adaptor is configured to receive and electrically connect to a standard RJ-45 8 pin modular plug for LAN applications.

21. The expansion device as recited in claim 18, wherein the expansion device has a thickness of approximately 10.5 mm.

* * * * *